US006781885B1

(12) United States Patent
Park et al.

(10) Patent No.: US 6,781,885 B1
(45) Date of Patent: Aug. 24, 2004

(54) METHOD OF PROGRAMMING A MEMORY CELL

(75) Inventors: Sheung Hee Park, Santa Clara, CA (US); Richard Fastow, Cupertino, CA (US); Wing Han Leung, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 167 days.

(21) Appl. No.: 10/379,885

(22) Filed: Mar. 5, 2003

(51) Int. Cl.$^7$ ............................................... G11C 11/34
(52) U.S. Cl. .............................. 365/185.28; 365/185.22
(58) Field of Search ....................... 365/185.28, 185.22

(56) References Cited

U.S. PATENT DOCUMENTS 4,698,787 A   10/1987   Mukherjee et al. ......... 365/185
5,477,499 A * 12/1995   Van Buskirk et al. ... 365/185.3

\* cited by examiner

Primary Examiner—M. Tran

(57) ABSTRACT

In programming the threshold voltage of a memory cell transistor having a substrate, a gate insulator on the substrate, a floating gate on the gate insulator, an insulating layer on the floating gate, and a control gate on the insulating layer, and a source and drain in the substrate, a voltage difference is applied between the drain and source of the transistor and negative voltage is applied to the substrate of the transistor. An increasing voltage is applied to the control gate of the transistor, and, during application of that increasing voltage, a succession of verification tests are undertaken at a corresponding succession of times separated by chosen time intervals to verify if the transistor has been programmed to a chosen threshold voltage.

7 Claims, 6 Drawing Sheets

METHOD OF PROGRAMMING A MEMORY CELL

BACKGROUND OF THE INVENTION

1. Technical Field

This invention relates generally to semiconductor devices, and more particularly, to the programming of an electrically programmable and erasable memory cell.

2. Background Art

A type of programmable memory cell is commonly referred to as a flash memory cell. Such flash memory cell may include a source and a drain formed in a silicon substrate, or in a well that is formed in the silicon substrate. The flash memory cell includes a stacked gate structure formed on the silicon substrate. The region of the silicon substrate beneath the stacked gate structure is known as the channel region of the flash memory cell.

The stacked gate structure of the flash memory cell includes a pair of polysilicon structures separated by oxide layers. One of the polysilicon structures functions as a floating gate and the other polysilicon structure functions as a control gate for the flash memory cell. The oxide layer that separates the floating gate from the silicon substrate is commonly referred to as a tunnel oxide layer. A memory cell of this type is shown and described in U.S. Pat. No. 4,698,787, "Single Transistor Electrically Programmable Memory Device and Method", issued to Mukherjee et al. on Oct. 6, 1987.

Programming operations on a flash memory cell involve the application of a relatively large constant voltage to the drain of the flash memory cell while an even larger voltage is applied to the control gate. During such a programming operation, the source of the flash memory cell is maintained at a ground level or a zero voltage level in relation to the voltages applied to the control gate and drain. The high constant voltage applied to the control gate raises the voltage potential of the floating gate to a high level at the start of the programming operation. Such a high voltage potential on the floating gate attracts the electrons floating through the channel region. Under these conditions, electrons in the channel region having sufficiently high kinetic energy migrate through the tunnel oxide layer and onto the floating gate. This phenomenon is commonly referred to as hot carrier programming or hot carrier injection. A successful programming operation involves the injection of sufficient numbers of electrons onto the floating gate to achieve a desired threshold voltage for the flash memory cell. The threshold voltage is the voltage that must be applied to the control gate of the flash memory cell to cause conduction through the channel region during the read operation on the flash memory cell.

In a typical memory array which includes a large number of cells, a cell can be programmed by applying programming voltages of approximately 9–10 volts to the control gate, approximately 5 volts to the drain, and grounding the source. These voltages cause hot electrons to be injected from a drain depletion region into the floating gate. Upon removal of the programming voltages, the injected electrons are trapped in the floating gate and create a negative charge therein that increases the threshold of the cell to a value in excess of approximately 4 volts.

A cell can be read by applying a voltage of approximately 5 volts to the control gate, applying approximately 1 volt to the bit line to which the drain is connected, grounding the source, and sensing the bit line current. If the cell is programmed and the threshold voltage is relatively high (5 volts), the bit line current will be zero or relatively low. If the cell is not programmed or is erased, the threshold voltage will be relatively low (2 volts), the control gate voltage will enhance the channel, and the bit line current will be relatively high.

A cell can be erased in several ways In one approach, applying a relatively high voltage, typically 12 volts, to the source, grounding the control gate and allowing the drain to float erases a cell. This causes the electrons that were injected into the floating gate during programming to undergo Fowler-Nordheim tunneling from the floating gate through the thin tunnel oxide layer to the source. Applying a negative voltage on the order of −10 volts to the control gate, applying 5 volts to the source and allowing the drain to float can also erase the cell. Another method of erasing a cell is by applying 5 volts to the P well and −10 volts to the control gate while allowing the source and drain to float.

A memory cell 20 of this type is shown in FIG. 1. The cell 20 is one cell in an array thereof and includes a single transistor 22 having a source 24 and a drain 26 formed in a silicon substrate 28, and a gate stack 30 formed on the silicon substrate 28. The gate stack 30 of the flash memory cell 28 has a tunnel oxide 32 on the substrate 28 over the channel region between the source 24 and the drain 26, a polysilicon floating gate 34 on the tunnel oxide 32, a dielectric, for example ONO layer 36 on the floating gate 34, and a polysilicon control gate 38 of the dielectric layer 36.

During programming of the memory cell 20, chosen voltages are applied to the source 24 and drain 26 (for example grounding the source 24 and applying 5 volts to drain 26), and voltage $V_{cg}$, applied to the control gate 38 is ramped up from zero, increasing in a linear manner in direct proportion to time as shown in FIG. 3. This increasing voltage applied to the control gate 38 causes the threshold voltage $V_t$ of the cell 20 to increase with time (utilizing hot carrier injection) in accordance with for example the curve B shown in FIG. 4, which is an example of a plot of threshold voltage $V_t$ of a cell against log time. As noted, the programmed threshold voltage $V_t$ increases with time, being of moderate initial steepness, with the steepness thereof gradually decreasing as the voltage applied to the control gate 38 continues to be ramped up.

Starting with and during ramping up of the voltage to the control gate 38, at a succession of times separated by substantially equal time intervals, a corresponding succession of verification tests are undertaken, to determine the threshold voltage of the cell 20 at any given test time and to verify if the cell 20 has been programmed to a chosen threshold level $V_{t1}$. When a verification test has revealed for the first time that the threshold voltage of the cell 20 has reached the chosen threshold voltage $V_{t1}$, ramping up of voltage on the control gate 38 continues, and another, successive verification test is undertaken at the next successive time to again verify that the threshold voltage of the cell 20 has indeed reached the chosen threshold voltage $V_{t1}$. If it is again determined that the threshold voltage of the cell 20 has reached the chosen threshold voltage $V_{t1}$, voltage to the control gate 38 discontinued and the cell 20 is considered programmed.

The practice of this process in accordance with the above description can lead to substantial variations in the threshold voltages of programmed cells. Because of variations in the manufacturing process of the cells, the rate of programming times will vary slightly from cell to cell. This is illustrated by the three examples of threshold programming curves A, B, C of FIG. 4, corresponding to the programming of three different cells. If for each cell the successive verification tests are undertaken at the same times after initiation of the programming process, the programmed threshold levels for these cells can vary by differing levels from the chosen $V_{t1}$, as will now be described.

FIGS. 5, 6 and 7 show portions of the threshold programming curves A, B, and C respectively. In FIG. 5, for a cell having a threshold programming curve for example shown at curve A, FIG. 4, at time $t_1$ after initiation of the programming process, a verification test (one of a successive series thereof as described above) is undertaken, immediately prior to the cell being programed to the chosen threshold voltage $V_{t1}$, i.e., that time of the last verification test that has indicated that the threshold voltage $V_{t1}$ has not yet been reached. Then, at the next successive time $t_2$ of the next successive verification test, another verification test is undertaken, verifying that for the first time that the threshold voltage of the cell has reached the chosen threshold voltage $V_{t1}$. Then, in accordance with the above described process, at the next successive time $t_3$ ($t_2-t_1=t_3-t_2$) of the next successive verification test, another verification test is undertaken to again verify that the threshold voltage of the cell has reached the chosen threshold voltage $V_{t1}$. In this cell, the verification test undertaken at time $t_2$ has verified the threshold voltage of the cell as very close to the chosen threshold voltage $V_{t1}$ (FIG. 5), and the next successive verification test at time $t_3$ verifies an actual threshold voltage of the cell further above the chosen threshold voltage $V_{t1}$.

Referring to FIG. 6, for a different cell having a slightly different threshold programming curve (for example curve B in FIG. 4), again at time $t_1$ after initiation of the programming process (the interval from the initiation of the programming process to time $t_1$ being the same in both examples), a verification test (one of a successive series thereof as described above) is undertaken, immediately prior to the cell being programmed to the chosen threshold voltage $V_{t1}$, i.e., that time of the last verification test that has indicated that the threshold voltage $V_{t1}$ has not yet been reached. Then, at the next successive time $t_2$ (interval between $t_1$ and $t_2$ being the same as in the previous example), another verification test is undertaken, verifying that the threshold voltage of the cell has for the fist time reached the chosen threshold voltage $V_{t1}$. For this cell, the verification test taken at time $t_2$ has verified the threshold voltage of the cell as not as close to the chosen threshold voltage $V_{t1}$ as in the previous example, due to variations in the threshold programming curve from cell to cell as described above. The next successive verification test at time $t_3$ (interval between $t_2$ and $t_3$ the same as in the previous example) will verify an actual threshold voltage of the cell further above the chosen threshold voltage $V_{t1}$ than in the previous example, as will be seen when comparing FIG. 5 and FIG. 6.

Referring to FIG. 7, for yet another different cell having a slightly different threshold programming curve (for example curve C in FIG. 4), again at time $t_1$ after initiation of the programming process (the interval from the initiation of the programming process to time $t_1$ being the same in all three examples), a verification test (one of a successive series thereof as described above) is undertaken, immediately prior to the cell being programmed to the chosen threshold voltage $V_{t1}$, i.e., that time of the last verification test that has indicated that the threshold voltage $V_{t1}$ has not yet been reached. Then, at the next successive time $t_2$ (interval between $t_1$ and $t_2$ being the same as in the previous examples), another verification test is undertaken, verifying that the threshold voltage of the cell has for the first time reached the chosen threshold voltage $V_{t1}$. For this cell, the verification test taken at time $t_2$ has verified the threshold voltage of the cell as not as close to the chosen threshold voltage $V_{t1}$ as in the previous example, due to variations in the threshold programming curve from cell to cell as described above. The next successive verification test at time $t_3$ (interval between $t_2$ and $t_3$ the same as in the previous examples) will verify an actual threshold voltage of the cell further above the chosen threshold voltage $V_{t1}$ than in the previous example, as will be seen when comparing FIG. 6 and FIG. 7.

As will be seen, the difference between the actual threshold voltage of a cell and its targeted threshold voltage $V_{t1}$ varies significantly from cell to cell (compare the threshold programming curves A, B and C of FIGS. 4, 5, 6 and 7 and the differences X, Y and Z between the actual threshold voltage of a cell and its targeted threshold voltage $V_{t1}$, FIGS. 5, 6 and 7 for the three examples given). This is due to the fact that the steepness of the threshold programming curves decrease only gradually upon increase in voltage applied to the control gate, so that the slope of the curve in the region of $V_{t1}$ is still significant, causing a relatively large increase in cell threshold voltage for a giving time difference between successive verifications of threshold voltage. This results in programmed cells in an array having a wide variation in threshold voltage.

FIG. 2 is a graph illustrating threshold voltage distribution vs. number of cells (curve $DIST_1$) in a flash memory array wherein the cells are programmed by the above method, indicating the significant variation in threshold voltage of the cells. This wide variation can lead to serious operational difficulties in the array, slowing down operation of the array.

In addition, with the steepness or slope of a programmed threshold voltage curve being only moderate as the voltage applied to the control gate is ramped up (FIG. 4), a substantial amount of time is required to reach the targeted threshold voltage $V_{t1}$, slowing down operation of the array.

Therefore, what is needed is a method for tightening the voltage threshold distribution of the cells of a memory array an increasing the programming speed thereof.

DISCLOSURE OF THE INVENTION

The present method is for programing the threshold voltage of a memory cell transistor having a substrate, a gate insulator on the substrate, a floating gate on the gate insulator, an insulating layer on the floating gate, and a control gate on the insulating layer, and a source and drain in the substrate. In the present method, a voltage difference is applied between the drain and source of the transistor. A negative voltage is applied to the substrate of the transistor. An increasing voltage is applied to the control gate of the transistor, and, during application of that increasing voltage to the control gate of the transistor, a succession of verification tests are undertaken at a corresponding succession of times separated by chosen time intervals to verify if the transistor has been programmed to a chosen threshold voltage.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 1:
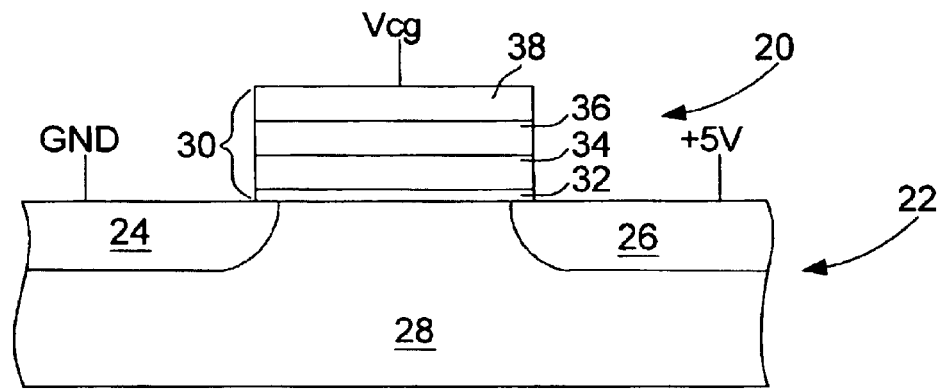
FIG. 1 is a cross-sectional view of a flash memory cell transistor in accordance with the prior art.
Figure 8:
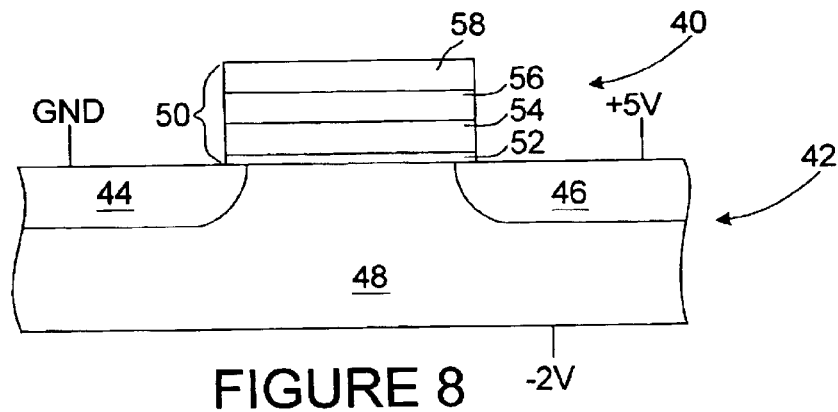
FIG. 8 is a cross-sectional view similar to that shown in FIG. 1, but illustrating the present method.

FIG. 8 illustrates a memory cell 40 of the type described above and shown in FIG. 1. That is, the cell 40, one of an array of cells, includes a single transistor 42 having a source 44 and a drain 46 formed in a silicon substrate 48, and a gate stack 50 formed on the silicon substrate 48. The gate stack 50 of the flash memory cell 40 has a tunnel oxide 52 on the substrate 48 over the channel region between the source 24 and the drain 26, a polysilicon floating gate 54 on the tunnel oxide 52, a dielectric, for example ONO layer 56 on the floating gate 54, and a polysilicon control gate 58 of the dielectric layer 56.

Figure 9:
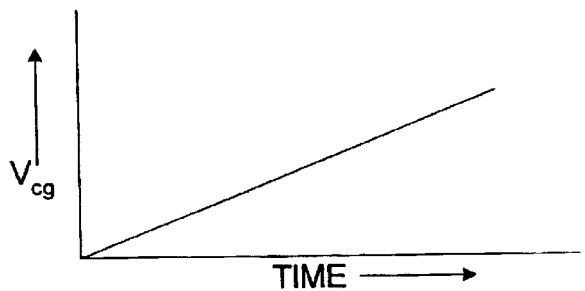
FIG. 9 is a graph similar to that shown in FIG. 3.
Figure 10:
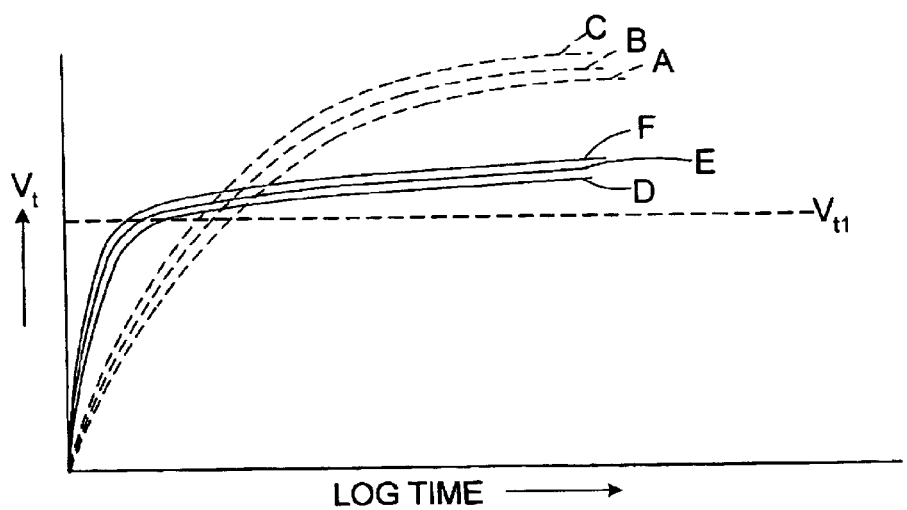
FIG. 10 is a graph similar to that shown in FIG. 4, but showing additional threshold programming curves achieved in accordance with the present invention.

During programming of the memory cell 40, an electrical potential difference in the form of a voltage difference is applied between the drain 46 and source 44 of the transistor 42, as previously described (for example grounding the source 44 and applying 5 volts to drain 46). However, instead of leaving the substrate 48 unbiased as in the prior art, i.e., having neither a positive nor negative voltage applied thereto, in the present situation, a negative bias of for example −2 volts is applied to the substrate 48. Then, voltage $V_{eg}$ to the control gate 58 is ramped up from zero, increasing in a linear manner in direct proportion to time as shown in FIG. 9. This increasing voltage $V_{eg}$ applied to the control gate 58 causes the threshold voltage $V_1$ of the cell 40 to increase with time (utilizing hot carrier injection). The negative bias on the substrate 48 causes the electric field near the source 44 to be increased as compared to the situation where such negative bias is not applied. This causes an increase in speed of transfer of electrons from the drain 46 through the tunnel oxide 52 to the floating gate 54 in the programming of the cell 40. In such state, the increasing voltage $V_{eg}$ applied to the control gate 58 causes the threshold voltage $V_1$ of the cell 40 to increase with time in accordance with for example the curve E, a plot of threshold voltage of a cell against log time. This curve E is clearly different from any of the curves A, B or C, being significantly steeper from its inception, substantially maintaining this significant steepness to beyond the targeted threshold voltage $V_{t1}$ and then decreasing in slope more abruptly and leveling off more rapidly at a lower level $V_t$ than in the prior art. This comparison is clearly shown in FIG. 10.

Again in this case, because of variations in the manufacturing process of the cells, the rate of programming times will vary slightly from cell to cell. This is illustrated by the three examples of threshold programming curves D, E and F, corresponding to the programming of three different cells.

The overall process flow is as follows. Initially, the source of the transistor is grounded, 5 volts are applied to the drain, and −2 volts are applied to the substrate (FIG. 8). Next, voltage $V_{eg}$ is applied to the control gate and ramped up from zero, increasing in a linear manner in direct proportion to time as shown in FIG. 9. Starting with and during ramping up of the voltage $V_{eg}$ to the control gate, at a succession of times separated by substantially equal time intervals, a corresponding succession of verification tests are undertaken, to determine the threshold voltage of the cell at any given test time and to verify if the cell has been programmed to a chosen threshold level $V_{t1}$. When a verification test has revealed for the first time that the threshold voltage of the cell has reached the chosen threshold voltage $V_{t1}$, ramping up of voltage on the control gate continues, and another, successive verification test is undertaken at the next successive time to again verify that the threshold voltage of the cell has reached the chosen threshold voltage $V_{t1}$. If it is again determined that the threshold voltage of the cell has reached the chosen threshold voltage $V_{t1}$, voltage to the control gate is discontinued and the cell is considered programmed. The programming process is then repeated on another chosen cell, and so forth.

Again, the practice of this process in accordance with this description can lead to variations in the threshold voltages of programmed cells. As will be seen, the threshold programming curves D, E, F, fundamentally different in shape from the threshold programming curves A, B, C of the prior art, are slightly different from each other. However, in the present situation, the problems in programming caused by the difference in programming curves D, E, F (negative bias applied to substrate) are much less significant than those caused by the programming curves A, B, C (no bias applied to substrate) as will now be described.

Figure 11:
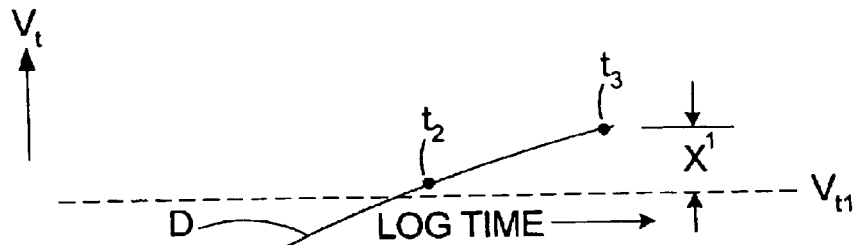
FIGS. 11–13 are enlarged portions of the graph of FIG. 10.
Figure 12:
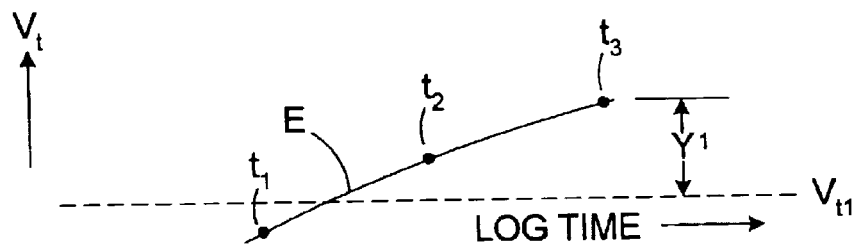
Figure 13:
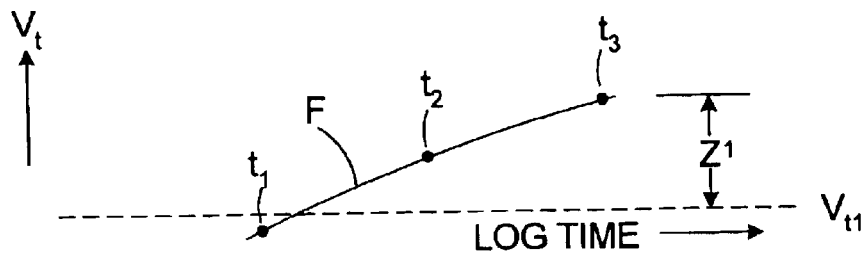

FIGS. 11, 12 and 13 show portions of the threshold programming curves D, E, and F respectively. In FIG. 11, for a cell having a threshold programming curve for example shown at curve D, FIG. 10, at time ti after initiation of the programming process, a verification test (one of a successive series thereof as described above) is undertaken, immediately prior to the cell being programmed to the chosen threshold voltage $V_{t1}$, i.e., that time of the last verification test that has indicated that the threshold voltage $V_{t1}$ has not yet been reached Then, at the next successive time $t_2$ of the next successive verification test, another verification test is undertaken, verifying that for the fist time that the threshold voltage of the cell has reached the chosen threshold voltage $V_{t1}$. Then, in accordance with the above described process, at the next successive time $t_3$ ($t_2-t_1=t_3-t_2$) of the next successive verification test, another verification test is undertaken to again verify that the threshold voltage of the cell has reached the chosen threshold voltage $V_{t1}$. In this cell, the verification test undertaken at time $t_2$ has verified the threshold voltage of the cell as very close to the chosen threshold voltage $V_{t1}$ (FIG. 11), and the next successive verification test at time $t_3$ verifies an actual threshold voltage of the cell further above the chosen threshold voltage $V_{t1}$.

Referring to FIG. 12, for a different cell having a slightly different threshold programming curve (for example curve E in FIG. 10), again at time $t_1$ after initiation of the programming process (the interval from the initiation of the programming process to time $t_1$ being the same in both examples), a verification test (one of a successive series thereof as described above) is undertaken, immediately prior to the cell being programmed to the chosen threshold voltage $V_{t1}$, i.e., that time of the last verification test that has indicated that the threshold voltage $V_{t1}$ has not yet been reached. Then, at the next successive time $t_2$ (interval between $t_1$ and $t_2$ being the same as in the previous example) another verification test is undertaken, verifying that the threshold voltage of the cell has for the fist time reached the chosen threshold voltage $V_{t1}$. For this cell, the verification test taken at time $t_2$ has verified the threshold voltage of the cell as not as close to the chosen threshold voltage $V_{t1}$ as in the previous example, due to variations in the threshold programming curve from cell to cell as described above. The next successive verification test at time $t_3$ (interval between $t_2$ and $t_3$ the same as in the previous example) will verify an actual threshold voltage of the cell further above the chosen threshold voltage $V_{t1}$ than in the previous example, as will be seen when comparing FIGS. 11 and 12.

Referring to FIG. 13, for a yet another different cell having a slightly different threshold programming curve (for example curve F in FIG. 10), again at time $t_1$ after initiation of the programming process (the interval from the initiation of the programming process to time $t_1$ being the same in all examples), a verification test (one of a successive series thereof as described above) is undertaken, immediately prior to the cell being programmed to the chosen threshold voltage $V_{t1}$, i.e., that time of the last verification test that has indicated that the threshold voltage $V_{t1}$ has not yet been reached. Then, at the next successive time $t_2$ (interval between $t_1$ and $t_2$ being the same as in the previous examples), another verification test is undertaken, verifying that the threshold voltage of the cell has for the first time reached the chosen threshold voltage $V_{t1}$. For this cell, the verification test taken at time $t_2$ has verified the threshold voltage of the cell as not as close to the chosen threshold voltage $V_{t1}$ as in the previous example, due to variations in the threshold programming curve from cell to cell as described above. The next successive verification test at time $t_3$ (interval between $t_2$ and $t_3$ the same as in the previous examples) will verify an actual threshold voltage of the cell further above the chosen threshold voltage $V_{t1}$ than in the previous example, as will be seen in comparing FIGS. 12 and 13.

Figure 5:
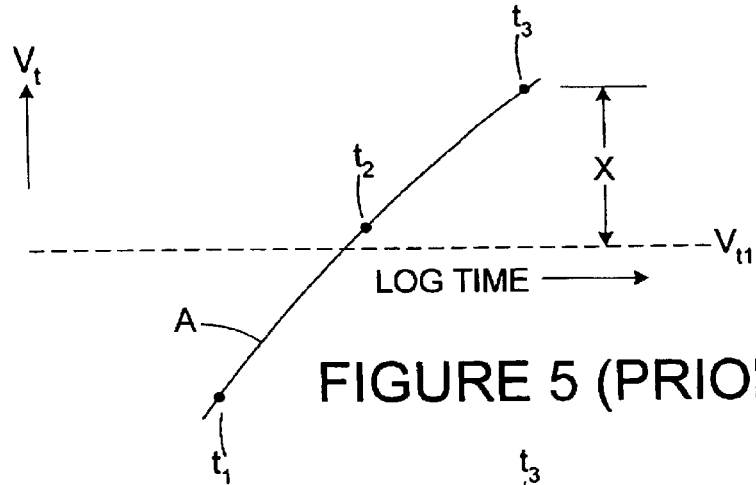
FIGS. 5–7 are enlarged portions of the graph of FIG. 4.
Figure 6:
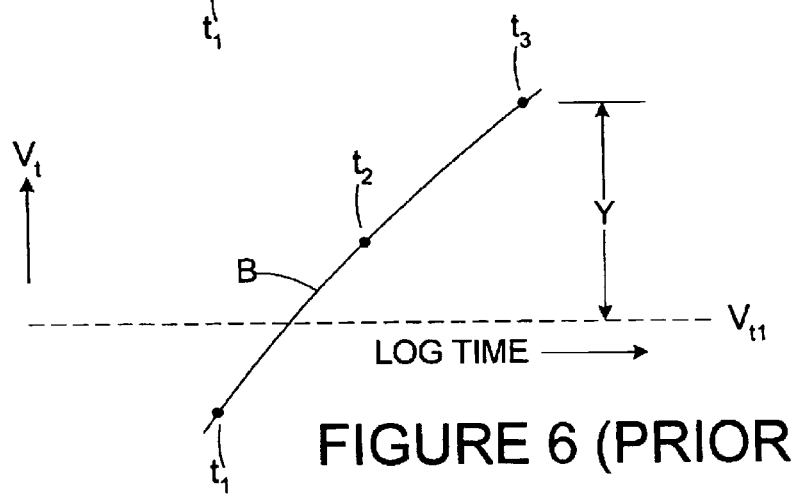
Figure 7:
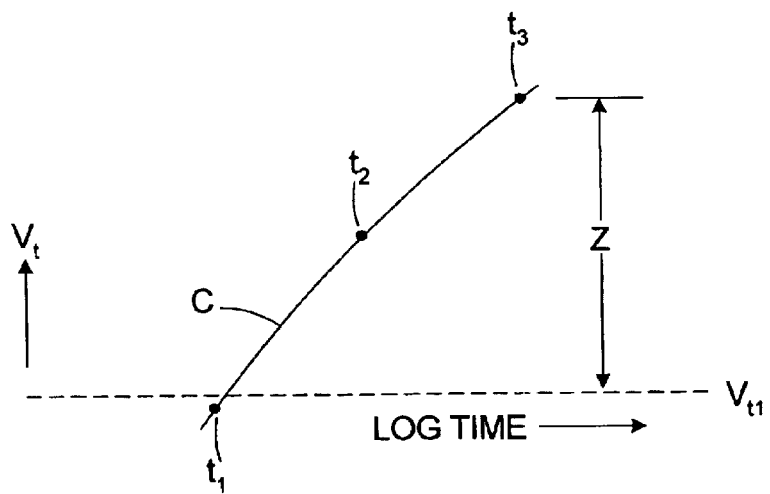

As will be seen, in the present method, the difference between the actual threshold voltage of a cell and its targeted threshold voltage $V_{t1}$ varies only slightly from cell to cell as compared to the prior art (compare on the one hand (i) the threshold programming curves A, B and C of FIGS. 4, 5, 6 and 7 and the differences X, Y and Z between the actual threshold voltage of a cell and its targeted threshold voltage $V_{t1}$, FIGS. 5, 6 and 7 for the three previous examples given, and on the other hand (i) the threshold programming curves D, E and F of FIGS. 10, 11, 12 and 13 and the differences X',Y' and Z' between the actual threshold voltage of a cell and its targeted threshold voltage $V_{t1}$, FIGS. 11, 12 and 13 for the three present examples given). As will be seen, the value X' is substantially less than the value X, the value Y' is substantially less than the value Y, and the value Z' is substantially less than the value Z. That is to say, in each case, the achieved threshold voltage of the cell is substantially closer to the chosen threshold voltage $V_{t1}$ than in the prior art. This is due to the fact that the threshold programming curves D, E and F are substantially less steep than the threshold programming curves A, B, C in the vicinity of the targeted threshold voltage $V_{t1}$, the steepness thereof having decreased more abruptly in that vicinity upon application of increasing voltage to the control gate than in the prior art That is to say, the threshold programming curves A, B, C have a substantially greater slope that the threshold programming curves D, E, F in the vicinity of the targeted threshold voltage $V_{t1}$. This causes, in the present process, substantially less increase in cell threshold voltage for a given time difference between successive verifications of threshold voltage in the region of the targeted threshold voltage (compare FIGS. 5, 6 and 7 with FIG. 11, 12 and 13). This significant improvement in programming results from applying a negative bias to the substrate during the programming operation as described above.

Figure 2:
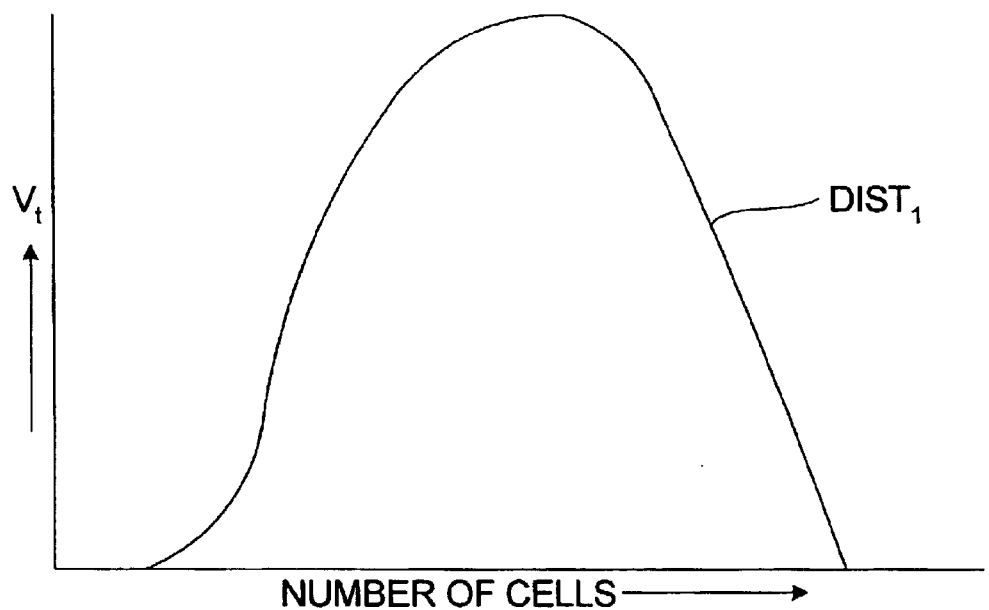
FIG. 2 is a graph illustrating a typical distribution of threshold voltages vs. number of cells in a flash memory array wherein cells are programmed by a typical programming method.
Figure 3:
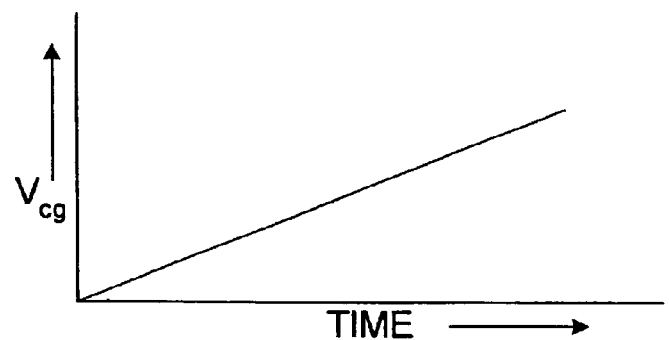
FIG. 3 is a graph illustrating ramping up of voltage applied to the control gate of the transistor vs. time, in accordance with the prior art.
Figure 4:
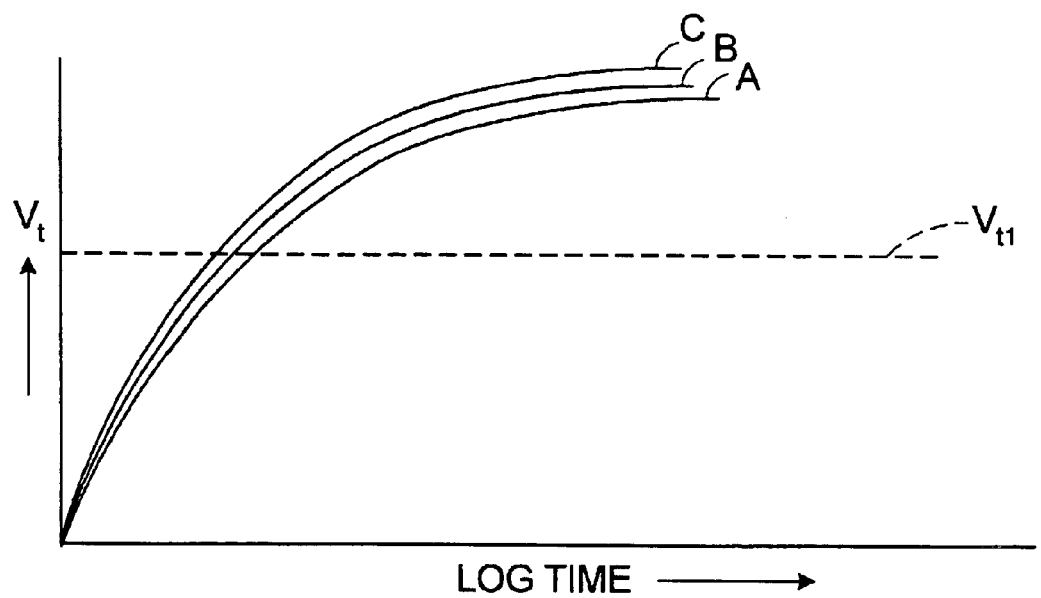
FIG. 4 is a graph illustrating threshold programming curves for three different examples of flash memory cells in accordance with the prior art.
Figure 14:
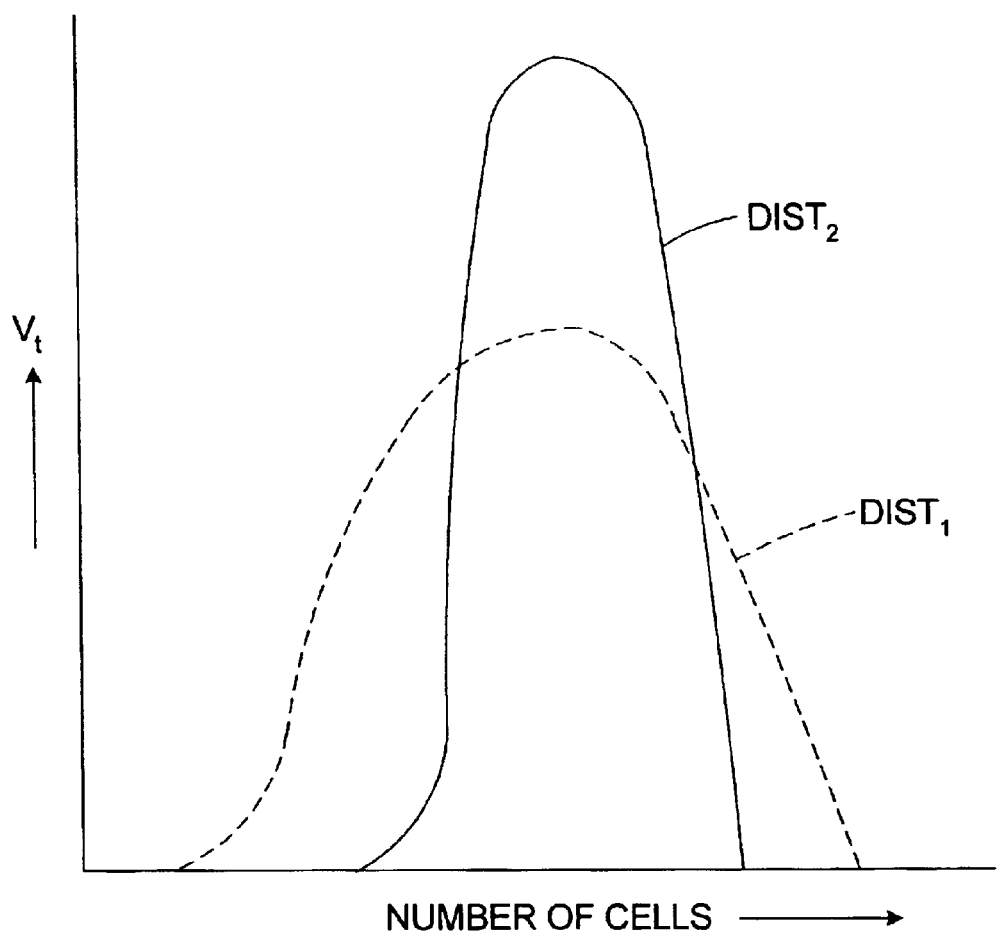
FIG. 14 is a graph illustrating the improved distribution of threshold voltage vs. number of cells in a flash memory array wherein the cells are programmed in accordance with the present method.

FIG. 14 is a graph illustrating threshold voltage distribution vs. number of cells in a flash memory array (curve $DIST_2$) wherein the cells are programmed by the present method, indicating substantially less variation in threshold voltage of the cells, i.e., a tighter distribution of threshold voltage for cells in an array thereof (compare curve $DIST_1$ from FIG. 2 overlaid on FIG. 14). This improvement leads directly to improvement in memory array performance.

Additionally, as discussed above and illustrated in the drawings, application of a negative bias to the substrate causes the slope of the threshold programming curve to be significantly greater from its inception to just beyond the targeted threshold voltage $V_{t1}$. It will readily be seen that this significantly reduces the programming time of a cell, improving operational speed of the array.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of programming the threshold voltage of a memory cell transistor comprising a substrate, a gate insulator on the substrate, a floating gate on the gate insulator, an insulating layer on the floating gate, a control gate on the insulating layer, and a source and a drain in the substrate, comprising:

applying an electrical potential difference in the form of a voltage difference between the drain and source of the transistor;

applying a negative voltage to the substrate of the transistor;

applying an increasing voltage to the control gate of the transistor; and during the application of increasing voltage to the control gate of the transistor, undertaking, at a succession of times separated by chosen time intervals, a corresponding succession of verification tests to verify if the transistor has been programmed to a chosen threshold voltage.

2. The method of claim 1 wherein the succession of times are separated by substantially equal time intervals.

3. The method of claim 2 and further comprising the step wherein, after the transistor, for the first time, has been verified as having been programmed to the chosen threshold voltage, again undertaking a verification test to verify if the transistor has been programmed to the chosen threshold voltage.

4. The method of claim 3 wherein the step of again undertaking a verification test comprises undertaking a verification test at the next successive time after the first time that the transistor has been verified as having been programmed to the chosen threshold voltage.

5. The method of claim 4 wherein the programming voltages are selected to utilize a hot-carrier injection mechanism.

6. The method of claim 5 wherein, during said programming, a positive voltage is applied to the drain and the source is grounded.

7. The method of claim 6 wherein, during said programming, the voltage applied to the control gate is an increasing positive voltage.

* * * * *